US Patent [19] Vickery, III

[11] Patent Number: 4,603,034
[45] Date of Patent: Jul. 29, 1986

[54] CRYSTAL GROWING SYSTEM

[76] Inventor: Earle R. Vickery, III, 4810 Sunderland Dr., Boise, Id. 83704

[21] Appl. No.: 367,626

[22] Filed: Apr. 12, 1982

Related U.S. Application Data

[63] Continuation of Ser. No. 220,445, Dec. 12, 1980, abandoned, which is a continuation of Ser. No. 55,609, Jul. 9, 1979, abandoned.

[51] Int. Cl.$^4$ .............................. C30B 15/10
[52] U.S. Cl. .................. 422/246; 156/617 M; 156/DIG. 96
[58] Field of Search ............ 156/617 SP, 608, 617 M, 156/615, 619, DIG. 88, DIG. 89, DIG. 64, DIG. 96; 422/246, 247, 249, 253; 423/324; 65/83, 85, 264

[56] References Cited

U.S. PATENT DOCUMENTS

| | | | |
|---|---|---|---|
| 1,593,567 | 7/1926 | Byrnes | 65/85 |
| 2,336,510 | 12/1943 | Spinasse | 65/85 |
| 3,218,143 | 11/1965 | Lajarte | 65/90 |
| 3,265,469 | 8/1966 | Hall | 422/249 |
| 4,108,714 | 8/1978 | Keller et al. | 156/608 |

FOREIGN PATENT DOCUMENTS

| | | | |
|---|---|---|---|
| 4113241 | 3/1964 | Japan | 156/DIG. 96 |
| 1354495 | 5/1974 | United Kingdom | 156/617 SP |

OTHER PUBLICATIONS

McGraw-Hill Dictionary of Scientific and Technical Terms 3rd Ed. 1984.

Primary Examiner—Hiram N. Bernstein
Attorney, Agent, or Firm—Blodgett & Blodgett

[57] ABSTRACT

System for formation of a mineral crystal having a regular cross-sectional shape, including a crucible, a mass of crystal nutrient melt in the crucible, and a cooling element which defines a growing zone on the surface of the nutrient melt.

3 Claims, 3 Drawing Figures

CRYSTAL GROWING SYSTEM

This is a continuation of patent application Ser. No. 220,445 filed Dec. 12, 1980, now abandoned, which is a continuation of application Ser. No. 55,609, filed July 9, 1979, now abandoned.

BACKGROUND OF THE INVENTION

The ever-increasing need for high quality mineral crystals, particularly as the building blocks for electronic components, has resulted in substantial progress in the development of techniques for growing synthethic crystals. One of the most successful techniques is the Czochralski or pulling methods. The pulling method is useful for growing crystals from the melt, when the crystal melts congruently, when the melt is of a low volatility, and when vessels which are non-reactive with the melt are available. The pulling method involves contacting a seed crystal with the surface of a nutrient melt and drawing the seed crystal away from the melt as the crystal grows at the interface. One drawback however, is that the resulting crystal is normally circular in cross-section. Because a circular cross-section is not the most economic from a processing point of view, it is desirable to somehow change this charcteristic of the system. One approach might be to isolate a certain area of the surface of the melt using a solid mask. The problem with a mask is that it would be very difficult to keep it from deteriorating due to the high temperature and reactivity of the nutrient melt for the period of time necessary to grow the crystals. This deterioration problem results in two unfavorable effects: first, the cross-sectional shape of the mask will change with time and thus cause an inconsistent crystal product and, second, the deteriorating mask will add impurities to the melt whose composition must be controlled within critical limits. These and other difficulties experienced with the prior art devices have been obviated in a novel manner by the present invention.

It is, therefore, an outstanding object of the invention to provide a system for growing crystals of a desired cross-section and, more specifically, crystals in sheet form.

Another object of this invention is the provision of a masking technique for use in the crystal pulling method.

A further object of the present invention is the provision of a masking technique for use in high temperature melts which does not contaminate the melt.

It is another object of the instant invention to provide a simple and relatively inexpensive method for providing electronic quality crystals of a shape which is optimum for subsequent processing.

With these and other objects in view, as will be apparent to those skilled in the art, the invention resides in the combination of parts set forth in the specification and covered by the claims appended hereto.

SUMMARY OF THE INVENTION

This invention involves a system for formation of mineral crystals having a regular cross-sectional shape, this system comprising a crucible, a mass of nutrient melt within the crucible, a heater for maintaining the melt at a first temperature, and a cooling element at the surface of the melt. Pulling apparatus is provided for contacting a seed crystal with the growing zone and then drawing the seed crystal away from the growing zone as the melt crystalizes on the seed crystal. A cooling fluid passes through the cooling element at a rate which controls the cooling effect of the element. The cooling effect is adjusted to allow a layer of solid nutrient melt to form around the cooling element and to protect it from the melt temperature.

BRIEF DESCRIPTION OF THE DRAWINGS

The character of the invention, however, may be best understood by reference to one of its structural forms, as illustrated by the accompany drawings, in which.

DESCRIPTION OF THE PREFERRED EMBODIMENT

Figure 1:
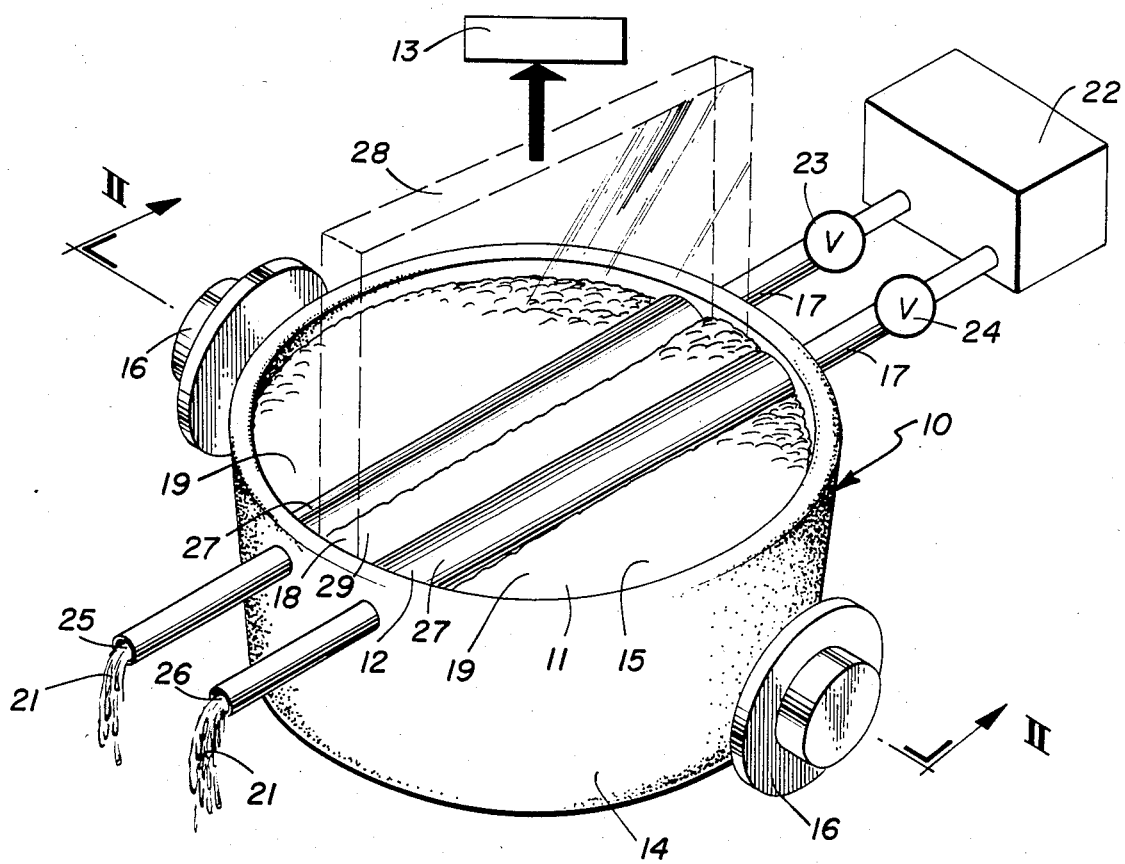
FIG. 1 is a perspective view of apparatus embodying the principles of the present invention.

Referring first to FIG. 1, in which are shown the general features of the present invention, the crystal growing system, indicated generally by the numeral 10, is shown to include a nutrient source 11, a masking system 12, and a pulling system 13. The nutrient source 11 includes a crucible 14 for containing a body of nutrient melt 15. The crucible material will be chosen to be non-reactive with the nutrient at the temperature of the melt. The nutrient in the preferred embodiment would be ultra-pure silicone. The nutrient would be melted using ratio frequency heaters 16.

The masking system 12 consists primarily of cooling tubes 17 which are partially submerged in the surface of the nutrient melt 15 to divide the surface into a growing zone 18 and a non-growing zone 19. The cooling tubes in the preferred embodiment would be made of copper, but might also be formed of a material, such as quartz, that is resistant to high temperature. Through the tubes is passed a cooling fluid 21. The cooling fluid 21 is fed to the cooling tubes 17 from a cooling fluid source 22 and through valves 23 and 24. The cooling fluid 21 passes from the tubes at exits 25 and 26. The rate of flow of the cooling fluid 21 through the cooling tube 17 is controlled by valves 23 and 24. This rate is selected at such a value as to carry away heat in sufficient amounts to allow a layer of solidified nutrient 27 to form around the outside of the cooling tubes 17. This layer of solid nutrient 27 formed around the cooling tubes has three functions. First, it physically isolates the material of the cooling tubes from the nutrient melt to avoid contamination of the ultra pure nutrient melt. Second it thoroughly insulates the cooling tubes from the melt which would normally be at a temperature far in excess of the melting point of the material from which the tubes are made. The flow of coolng fluid in the masking system would be adjusted so that the melting temperature of the material from which the cooling tubes are made occurs somewhere within the solid nutrient layer rather than within the cooling tubes. Third, by adjusting the flow of cooling fluid through the masking system, the thickness of the solid nutrient layer can be adjusted and is this way, the dimension of the growing zone 18 can be precisely adjusted.

The pulling system 13 includes apparatus for bringing a seed crystal 28 into contact with the growing zone 18 and then precisely drawing the seed crystal from the growing zone at a rate precisely equal to the optimum growing rate of the melt-seed crystal interface 29. The pulling system 13 also includes various oscillating devices and control devices well known in the art of pulling crystals.

Figure 2:
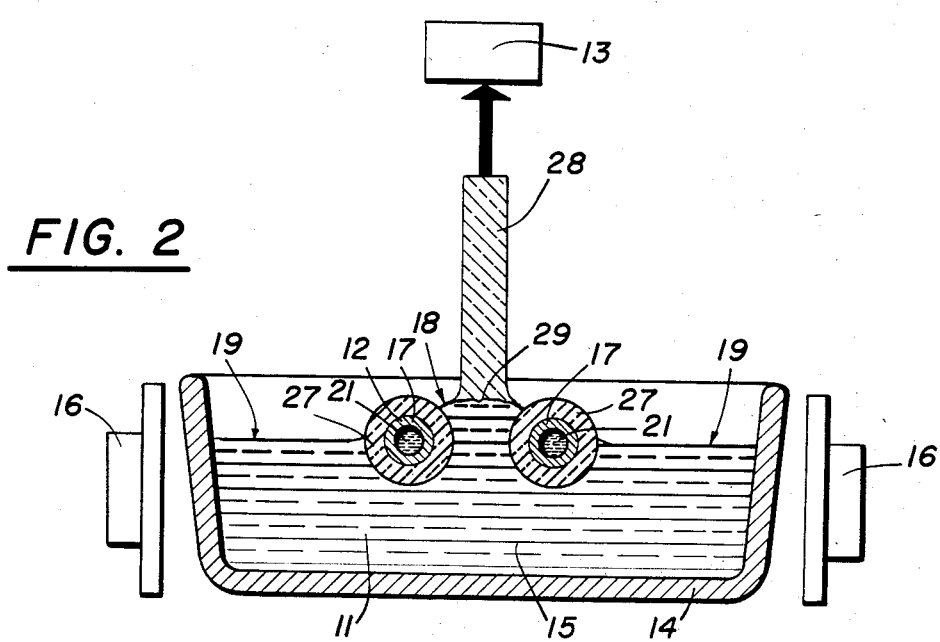
FIG. 2 is a cross-sectional view of the apparatus of the present invention taken along line II—II of FIG. 1.

FIG. 2 is a cross-sectional view of the system. It shows clearly the concept that the thickness of the solid nutrient layers 27 on each cooling tube 17 control the thickness dimension of the growing zone 18. As shown in FIG. 2, the dimensions of the growing zone 18 are normally such that the zone is a meniscus between the cooling rods.

The operation of the present invention will now be readily understood in view of the above description. The apparatus is first set up as generally shown in FIG. 1 without the seed crystal 28 in place. The flow of the cooling fluid 21 is set at a high value to protect the material of the cooling tubes 17. The cooling tubes are adjusted so that they define a growing area 18 slightly larger than desired in the final product. The crucible 14 is then filled with solid nutrient and the radio-frequency or induction-type heaters 16 are turned on. As the nutrient melts, it forms a solid layer 27 between the melt and the cooling tubes 17. The flow of the cooling fluid 21 is then adjusted by valves 23 and 24 to set the thickness of the solid nutrient layer 27 around the cooling tubes at a desired dimension. The seed crystal 28 is then lowered into the growing zone to form the growing interface 29 and the pulling system 13 is activated to draw the seed crystal from the growing zone as the growing takes place at the interface.

Although this technique can be used to grow crystals of various cross-sections depending on how the cooling tubes are arranged to form the growing zone 18, the cost effective shape is a cross-section which is long in the dimension parallel to the cooling tubes and very small in the dimension perpendicular to the cooling tubes. Thus, a sheet of crystalline material can be formed with a precisely controlled thickness.

Figure 3:
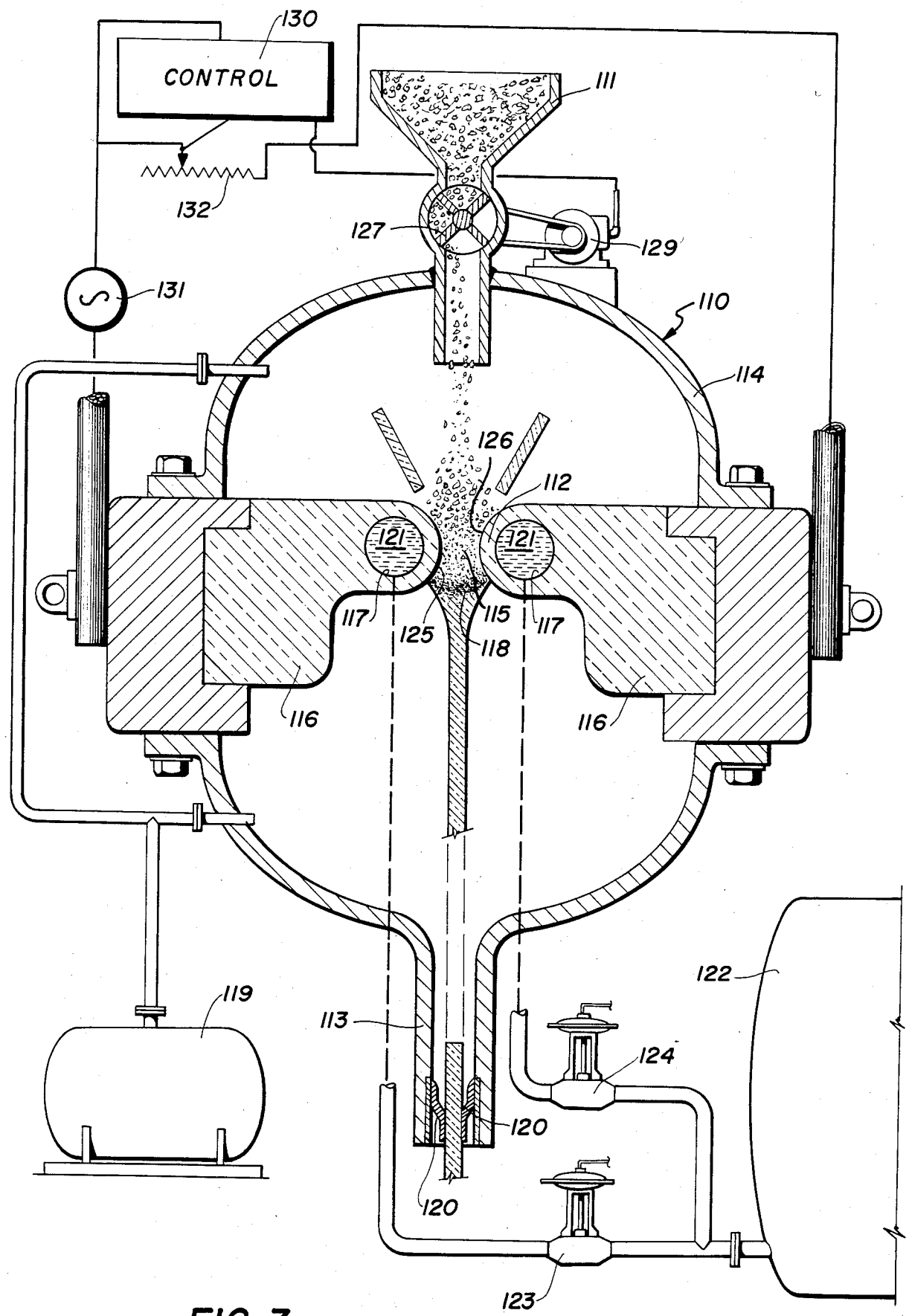
FIG. 3 is a vertical sectional view of a modified form of the invention.

Referring next to FIG. 3, which shows a modified form of the invention, the crystal growing system, indicated generally by the reference numeral 110, is shown as including a nutrient source 111 feeding particulate nutrient material to a masking system 112. The pulling system 113 allows the finished crystal to be withdrawn from the system. The crucible 114 is shown as having a complete enclosure and providing for a melt 115 between two heaters 116. Within the heaters are cooling tubes or passages 117 and between the heaters is a growing zone 118. Cooling fluid 121 passes through the passages 117 to regulate the temperature of the heater. The fluid originates in a fluid source 122, the flow of the passages being regulated by valves 123 and 124. The seed crystal 128 is formed below the growing zone 118.

A pressurized gas source 119 is connected to the interior of the crucible enclosure with a neutral gas, such as nitrogen. The heaters 116 consist of two electrodes formed of the same semi-conductor material as the crystal to be grown and they have spaced, parallel, cylindrical surfaces 125 and 126, defining a gap of the cross-sectional shape desirable in the finished crystal.

The cooling passages 117 are closed to the surfaces 125 and 126 and in the preferred embodiment are concentric with them. The nutrient source 111 is shown as consisting of a feeder for introducing particulate into the interior of the crystal without loss of the gaseous atmosphere and includes a rotor 127 driven by an electric motor 129. The pulling system 113 includes a pair of seals 120 through which the formed crystal 128 can slide without loss of the atmosphere within the crucible. A control 130 is provided to control the electrical flow across the electrodes. The current originates in an electrical source 131 which, in the preferred embodiment, is 110 volts A/C 60 HZ. The control is connected to a rheostat 132 to control the heating and to the motor 129 to control the feed rate.

It is obvious that minor changes may be made in the form and construction of the invention without departing from the material spirit thereof. It is not, however, desired to confine the invention to the exact form herein shown and described, but it is desired to include all such as properly come within the scope claimed.

The invention having been thus described, what is claimed as new and desired to secure by Letters Patent is:

1. Apparatus for forming a mineral crystal comprising:
    (a) a crucible for holding nutrient mineral crystal forming material,
    (b) a heater for melting nutrient mineral material in the crucible to form a molten mass of said material, said molten mass having an upper surface,
    (c) a pair of spaced forming elements including an external layer of solid nutrient material supported in a fixed relationship with respect to said crucible so that said elements are located at said upper surface and at least a portion of each of the elements extendsd below the upper surface of said mass and defines therebetween a crystal-growing zone,
    (d) internal fluid means including a control for regulating the cooling of the forming elements to a temperature sufficiently below that of the melting temperature of said nutrient material so as to assure that the said external layer of solidified nutrient material is maintained on the forming elements while still maintaining an area of molten nutrient material within said crystal-growing zone, and
    (e) means for drawing a crystal of said mineral material from said growing zone.

2. Apparatus as recited in claim 1, wherein each of the forming elements contains a conduit, and the cooling means includes means for circulating a cooling fluid through the conduits.

3. Apparatus as recited in claim 1, wherein the forming elements consist of a pair of spaced electrodes, the said electrodes being effective for generating sufficient heat in a zone between them to melt the said nutrient material.

* * * * *